United States Patent
Shih et al.

(10) Patent No.: US 11,342,333 B2
(45) Date of Patent: May 24, 2022

(54) SEMICONDUCTOR DEVICE

(71) Applicant: NANYA TECHNOLOGY CORPORATION, New Taipei (TW)

(72) Inventors: Shing-Yih Shih, New Taipei (TW); Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 90 days.

(21) Appl. No.: 16/583,288

(22) Filed: Sep. 26, 2019

(65) Prior Publication Data

US 2021/0098461 A1 Apr. 1, 2021

(51) Int. Cl.
*H01L 27/108* (2006.01)
*H01L 23/528* (2006.01)
*H01L 49/02* (2006.01)

(52) U.S. Cl.
CPC ...... *H01L 27/10817* (2013.01); *H01L 23/528* (2013.01); *H01L 27/10852* (2013.01); *H01L 28/90* (2013.01)

(58) Field of Classification Search
None
See application file for complete search history.

(56) References Cited

U.S. PATENT DOCUMENTS

| 10,340,277 | B2 | 7/2019 | Song et al. | |
| 2012/0104559 | A1* | 5/2012 | Kim | H01L 23/585 |
| | | | | 257/618 |
| 2013/0228837 | A1* | 9/2013 | Sukekawa | H01L 28/91 |
| | | | | 257/532 |
| 2018/0019243 | A1* | 1/2018 | Kim | H01L 28/90 |
| 2018/0158827 | A1* | 6/2018 | You | H01L 27/10814 |
| 2018/0158829 | A1* | 6/2018 | Song | H01L 28/90 |

* cited by examiner

*Primary Examiner* — Khaja Ahmad
(74) *Attorney, Agent, or Firm* — CKC & Partners Co., LLC

(57) ABSTRACT

A semiconductor device includes a semiconductor substrate having a cell region and a dummy region surrounding the cell region, a plurality of memory pillar structures, and a supporting layer. The memory pillar structures are on the cell region. The supporting layer is over the semiconductor substrate, interconnecting the memory pillar structures, and having a plurality of first and second opening patterns on the cell region. A first number of the memory pillar structures surround each of the first opening patterns, and a second number of the memory pillar structures surround each of the second opening patterns. The first opening patterns are different from the second opening patterns, the first number is different from the second number, and at least one of the first opening patterns and at least one of the second opening patterns are on a central portion of the cell region.

17 Claims, 13 Drawing Sheets

SEMICONDUCTOR DEVICE

BACKGROUND

Field of Invention

The present disclosure relates to a semiconductor device.

Description of Related Art

Semiconductor memory devices employ capacitors as information storage elements. To meet the demands of high-capacity and high-density semiconductor memory devices, capacitors are continually subject to further miniaturization. However, with such miniaturization, in order for the capacitors to maintain adequate capacitance for proper device operation, lengthening of the capacitors in the vertical direction is required. Therefore, research has been continuously conducted for new integration techniques.

SUMMARY

The present disclosure relates in general to a semiconductor device.

According to an embodiment of the present disclosure, a semiconductor device includes a semiconductor substrate, a plurality of memory pillar structures, and a supporting layer. The semiconductor substrate has a cell region and a dummy region surrounding the cell region. The memory pillar structures are on the cell region of the semiconductor substrate. The supporting layer is over the semiconductor substrate, interconnecting the memory pillar structures, and having a plurality of first opening patterns and second opening patterns on the cell region. A first number of the memory pillar structures surround each of the first opening patterns, and a second number of the memory pillar structures surround each of the second opening patterns. The first opening patterns are different from the second opening patterns, the first number of the memory pillar structures is different from the second number of the memory pillar structures, and at least one of the first opening patterns and at least one of the second opening patterns are on a central portion of the cell region.

In an embodiment of the present disclosure, the semiconductor device further includes a plurality of dummy pillar structures on the dummy region of the semiconductor substrate.

In an embodiment of the present disclosure, shapes of the first opening patterns are the same, and shapes of the second opening patterns are the same.

In an embodiment of the present disclosure, the first opening patterns and the second opening patterns are staggered in a first direction.

In an embodiment of the present disclosure, the first opening patterns or the second opening patterns are repeatedly arranged in a second direction.

In an embodiment of the present disclosure, the first number of the memory pillar structures is less than the second number of the memory pillar structures.

In an embodiment of the present disclosure, the first number of the memory pillar structures is three, and the second number is four of the memory pillar structures.

In an embodiment of the present disclosure, the first number of the memory pillar structures is three, and the second number of the memory pillar structures is five.

In an embodiment of the present disclosure, the first number of the memory pillar structures is four and the second number of the memory pillar structures is five.

In an embodiment of the present disclosure, the semiconductor device further includes an interlayer dielectric and a plurality of conductive structures. The interlayer dielectric is on the semiconductor substrate. The conductive structures are in the interlayer dielectric, and the memory pillar structures are respectively on the conductive structures.

In an embodiment of the present disclosure, the memory pillar structures are respectively aligned with the conductive structures.

In an embodiment of the present disclosure, the memory pillar structures are respectively in contact with top surfaces of the conductive structures.

In an embodiment of the present disclosure, each of the memory pillar structures comprises a horizontal portion and a vertical portion surrounding the horizontal portion.

In an embodiment of the present disclosure, the semiconductor device further includes a top electrode layer over the memory pillar structures and the supporting layer, wherein the top electrode layer has portions surrounded by the vertical portions of memory pillar structures.

In an embodiment of the present disclosure, each of the memory pillar structures is a bottom electrode layer with a U cross-sectional shape.

In an embodiment of the present disclosure, the semiconductor device further includes a first dielectric layer and a top electrode layer. The first dielectric layer is disposed along the supporting layer and the memory pillar structures. The top electrode layer is over the first dielectric layer.

In an embodiment of the present disclosure, the semiconductor device further includes a second dielectric layer between the first dielectric layer and the interlayer dielectric.

In the aforementioned embodiments of the present disclosure, since the first opening patterns are different from the second opening patterns, and at least one of the first opening patterns and at least one of the second opening patterns are on the central portion of the cell region, positions of the first and second opening patterns can be adjusted both on the central portion and the edge portion of the cell region to ensure that all of the first and second opening patterns are within the cell region without extending into the dummy region. As a result of such a configuration, the supporting layer does not need to horizontally extend into a peripheral circuit area outside the dummy region of the semiconductor substrate.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
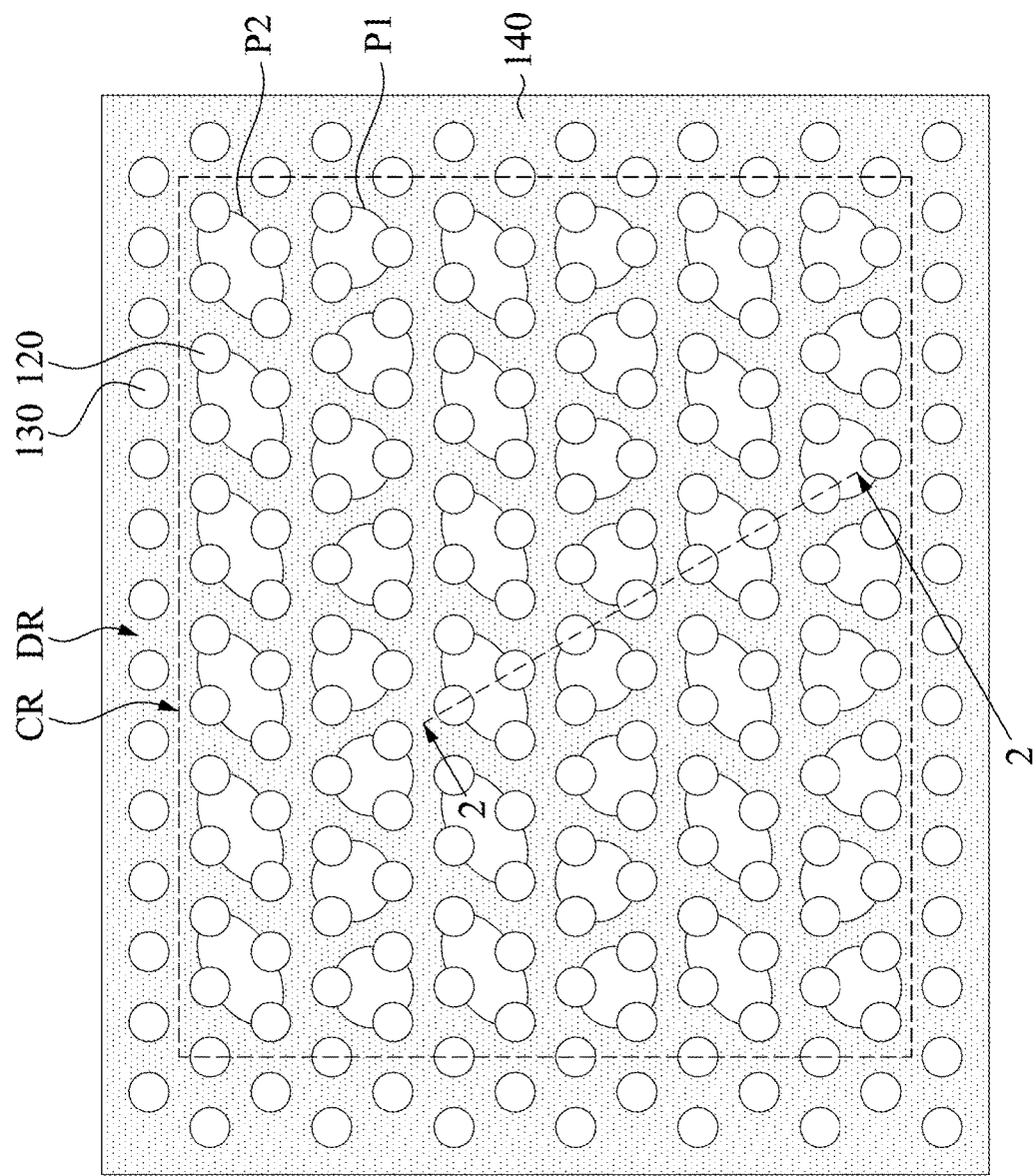
FIG. 1 is a top view illustrating a semiconductor device according to an embodiment of the present disclosure, in which a top electrode layer and a first dielectric layer are omitted.

Reference will now be made in detail to the present embodiments of the disclosure, examples of which are illustrated in the accompanying drawings. Wherever possible, the same reference numbers are used in the drawings and the description to refer to the same or like parts.

Figure 2:
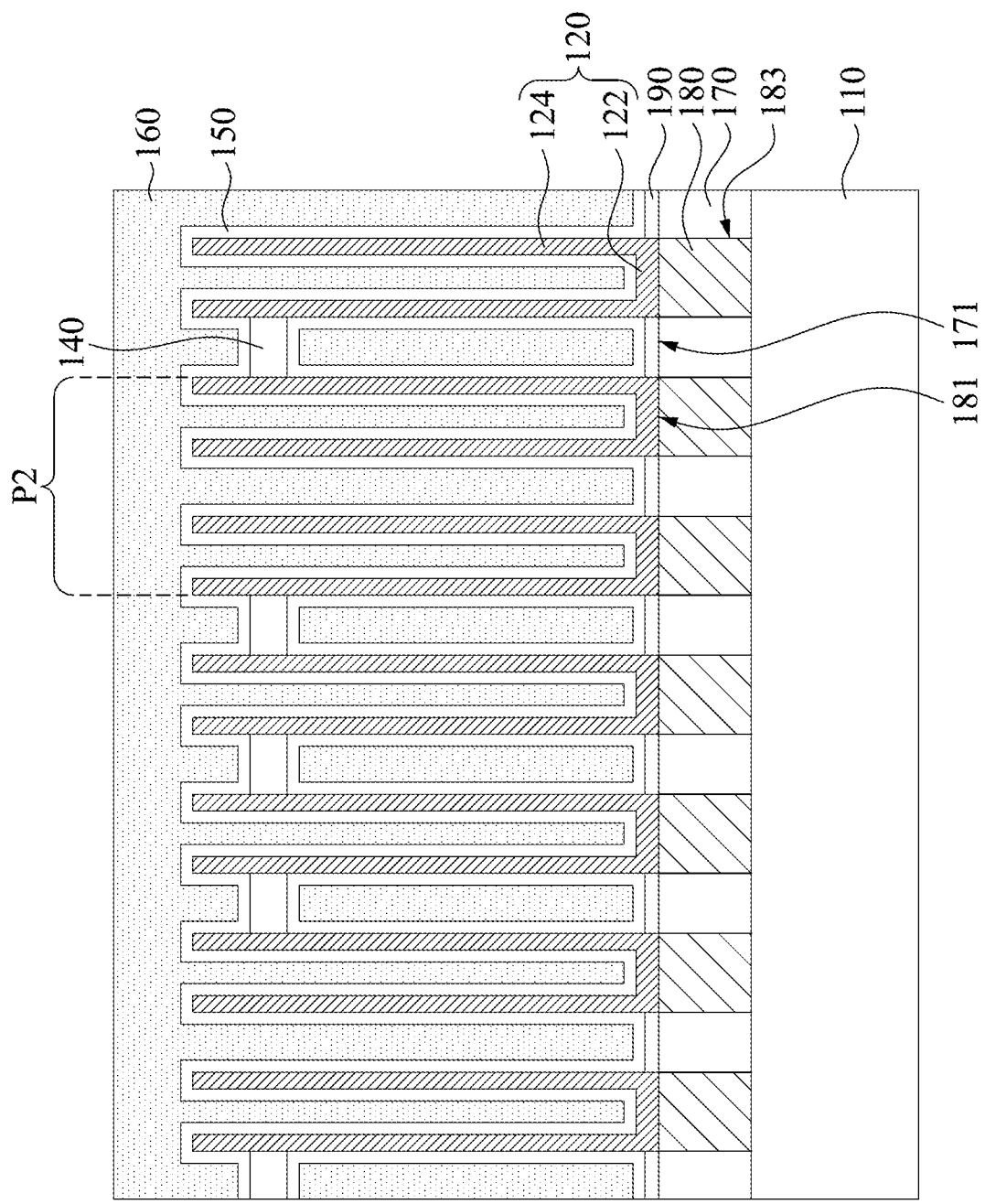
FIG. 2 is a cross-sectional view of the semiconductor device taken along line 2-2 of FIG. 1.

FIG. 1 is a top view illustrating a semiconductor device 100 according to an embodiment of the present disclosure. FIG. 2 is a cross-sectional view of the semiconductor device 100 taken along line 2-2 of FIG. 1. A top electrode layer 160 and a first dielectric layer 150 of FIG. 2 are omitted in FIG. 1. Reference is made to FIG. 1 and FIG. 2. The semiconductor device 100 includes a semiconductor substrate 110, a plurality of memory pillar structures 120, and a plurality of dummy pillar structures 130. The semiconductor substrate 110 has a cell region CR and a dummy region DR surrounding the cell region CR. The cell region CR has a central portion and an edge portion, in which the edge portion is between the central portion of the cell region CR and the dummy region DR. Stated differently, the edge portion interconnects the central portion of the cell region CR and the dummy region DR. The memory pillar structures 120 are arranged and operated on the cell region CR of the semiconductor substrate 110 to perform memory functions. The dummy pillar structures 130 are arranged on the dummy region DR of the semiconductor substrate 110 without performing any memory function, that is, the dummy pillar structures 130 are inoperable. Furthermore, a peripheral circuit area (not shown in the drawings) may be located outside the dummy region DR of the semiconductor substrate 110.

In some embodiments, the semiconductor device 100 further includes a supporting layer 140 over the semiconductor substrate 110. The supporting layer 140 interconnects the memory pillar structures 120 on the cell region CR, interconnects the dummy pillar structures 130 on the dummy region DR, and interconnects the memory pillar structures 120 and the dummy pillar structures 130 respectively on the cell region CR and the dummy region DR. Furthermore, the supporting layer 140 has a plurality of first opening patterns P1 and second opening patterns P2 on the cell region CR. A first number of the memory pillar structures 120 surround each of the first opening patterns P1, and a second number of the memory pillar structures 120 surround each of the second opening patterns P2. The first opening patterns P1 are different from the second opening patterns P2, the first number of the memory pillar structures 120 is different from the second number of the memory pillar structures 120, and at least one of the first opening patterns P1 and at least one of the second opening patterns P2 are on the central portion of the cell region CR.

Since the first opening patterns P1 are different from the second opening patterns P2, and at least one of the first opening patterns P1 and at least one of the second opening patterns P2 are on the central portion of the cell region CR, positions of the first and second opening patterns P1, P2 can be adjusted both on the central portion and the edge portion of the cell region CR to ensure that all of the first and second opening patterns P1, P2 are within the cell region CR without extending into the dummy region DR. As a result of such a configuration, the supporting layer 140 does not need to horizontally extend into the peripheral circuit area outside the dummy region DR of the semiconductor substrate 110.

In some embodiments, the first number of the memory pillar structures 120 is less than the second number of the memory pillar structures 120. For example, as shown in FIG. 1, the first number of the memory pillar structures 120 is three, and the second number of the memory pillar structures 120 is four. Furthermore, the first opening patterns P1 and the second opening patterns P2 may be staggered in a first direction D1, while the first opening patterns P1 and the second opening patterns P2 may be repeatedly arranged in a second direction D2, in which the first direction D1 is perpendicular to the second direction D2. Additionally, shapes of the first opening patterns P1 may be the same, and shapes of the second opening patterns P2 may also be the same. In some embodiments, the orientations of the first opening patterns P1 are consistent, and the orientations of the second opening patterns P2 are also consistent, but the present disclosure is not limited in this regard. Furthermore, each of the first opening patterns P1 has a circular shape, and each of the second opening patterns P2 has an oval shape.

As shown in FIG. 1 and FIG. 2, each of the memory pillar structures 120 may have a uniform thickness, and may include a horizontal portion 122 and a vertical portion 124 surrounding the horizontal portion 122. Stated differently, each of the memory pillar structures 120 may have a circular cross-sectional shape in a plan view and a U cross-sectional shape in a cross-sectional view. In other words, each of the memory pillar structures 120 may have a hollow-cup shape. In some embodiments, each of the memory pillar structures 120 may serve as a bottom electrode layer. Furthermore, the memory pillar structures 120 may be spaced apart from each other at a same interval, that is, distances between every two adjacent memory pillar structures 120 may be the same. The memory pillar structures 120 may be made of a material including titanium nitride or impurity-doped polysilicon, but the present disclosure is not limited in this regard.

In some embodiments, the memory pillar structures 120 and the dummy pillar structures 130 may have the same structural configuration (e.g., shape, thickness, interval therebetween, etc.) and may be made of the same material. For example, each of the dummy pillar structures 130 may also include a horizontal portion and a vertical portion surrounding the horizontal portion. In other words, the memory pillar structures 120 on the cell region CR of the semiconductor substrate 110 and the dummy pillar structures 130 on the dummy region DR of the semiconductor substrate 110 may be substantially identical, except for their functionality. It is noted that since the memory pillar structures 120 and the dummy pillar structures 130 are substantially identical, only the memory pillar structures 120 will be discussed in detail in the following description.

In some embodiments, the supporting layer 140 may be in contact with sidewalls of the vertical portions 124 of the memory pillar structures 120. Specifically, the supporting layer 140 may extend between two adjacent memory pillar structures 120 to prevent the memory pillar structures 120 from collapsing during a manufacturing process of the semiconductor device 100, which will be discussed later in the following description. The supporting layer 140 may be made of a material including silicon nitride, but the present disclosure is not limited in this regard.

In some embodiments, the semiconductor device 100 further includes a first dielectric layer 150 conformally covering the supporting layer 140 and the memory pillar structures 120. Stated differently, the first dielectric layer 150 is disposed along the supporting layer 140 and the memory pillar structures 120. Furthermore, the first dielectric layer 150 has a uniform thickness. The first dielectric layer 150 may be made of a material including metal oxide, such as aluminum oxide, which exhibits a dielectric constant greater than that of silicon oxide.

In some embodiments, the semiconductor device 100 further includes a top electrode layer 160 covering the first dielectric layer 150. Furthermore, the top electrode layer 160 has portions embedded into spaces between the vertical portions 124 of the memory pillar structures 120. In other words, the top electrode layer 160 has portions surrounded by the vertical portions 124 of the memory pillar structures 120. The top electrode layer 160 may be made of a material including titanium nitride, tungsten, impurity-doped polysilicon, impurity-doped silicon germanium, or combinations thereof, but the present disclosure is not limited in this regard.

Since the first dielectric layer 150 is disposed along the hollow-cup shaped memory pillar structures 120, and the top electrode layer 160 covers the first dielectric layer 150, combinations of the memory pillar structures 120 (i.e., the bottom electrode layer), the first dielectric layer 150, and the top electrode layer 160 form a plurality of capacitors with a high aspect ratio.

As shown in FIG. 1 and FIG. 2, the semiconductor device 100 further includes an interlayer dielectric 170 and a plurality of conductive structures 180. The interlayer dielectric 170 is on the semiconductor substrate 110, and the conductive structures 180 are in the interlayer dielectric 170 to be electrically connected to the semiconductor substrate 110. Additionally, a top surface 171 of the interlayer dielectric 170 is coplanar with top surfaces 181 of the conductive structures 180. The interlayer dielectric 170 may be made of a material including silicon oxide, and the conductive structures 180 may be made of a material including impurity-doped silicon, titanium nitride, tungsten, or combinations thereof, but the present disclosure is not limited in this regard.

In some embodiments, the memory pillar structures 120 are respectively on the conductive structures 180 and in contact with top surfaces 181 of the conductive structures 180. Furthermore, the memory pillar structures 120 are respectively aligned with the conductive structures 180. Specifically, outer sidewalls of the vertical portions 124 of the memory pillar structures 120 are respectively aligned with sidewalls 183 of the conductive structures 180, and the horizontal portions 122 of the memory pillar structures 120 entirely overlap the conductive structures 180, respectively.

In some embodiments, the semiconductor device 100 further includes a second dielectric layer 190 on the interlayer dielectric 170. The memory pillar structures 120 through the second dielectric layer 190 are in contact with the conductive structures 180. Furthermore, the second dielectric layer 190 is between the first dielectric layer 150 and the interlayer dielectric 170. The second dielectric layer 190 can prevent the first dielectric layer 150 from being in contact with the conductive structures 180. The second dielectric layer 190 may be made of a material including silicon nitride, but the present disclosure is not limited in this regard.

It is to be noted that the connection relationships and materials of the elements described above will not be repeated in the following description, and only aspects related to the first number of the memory pillar structures 120, the second number of the memory pillar structures 120, and the arrangement of the first opening patterns P1 and the second opening patterns P2 will be described.

Figure 3:
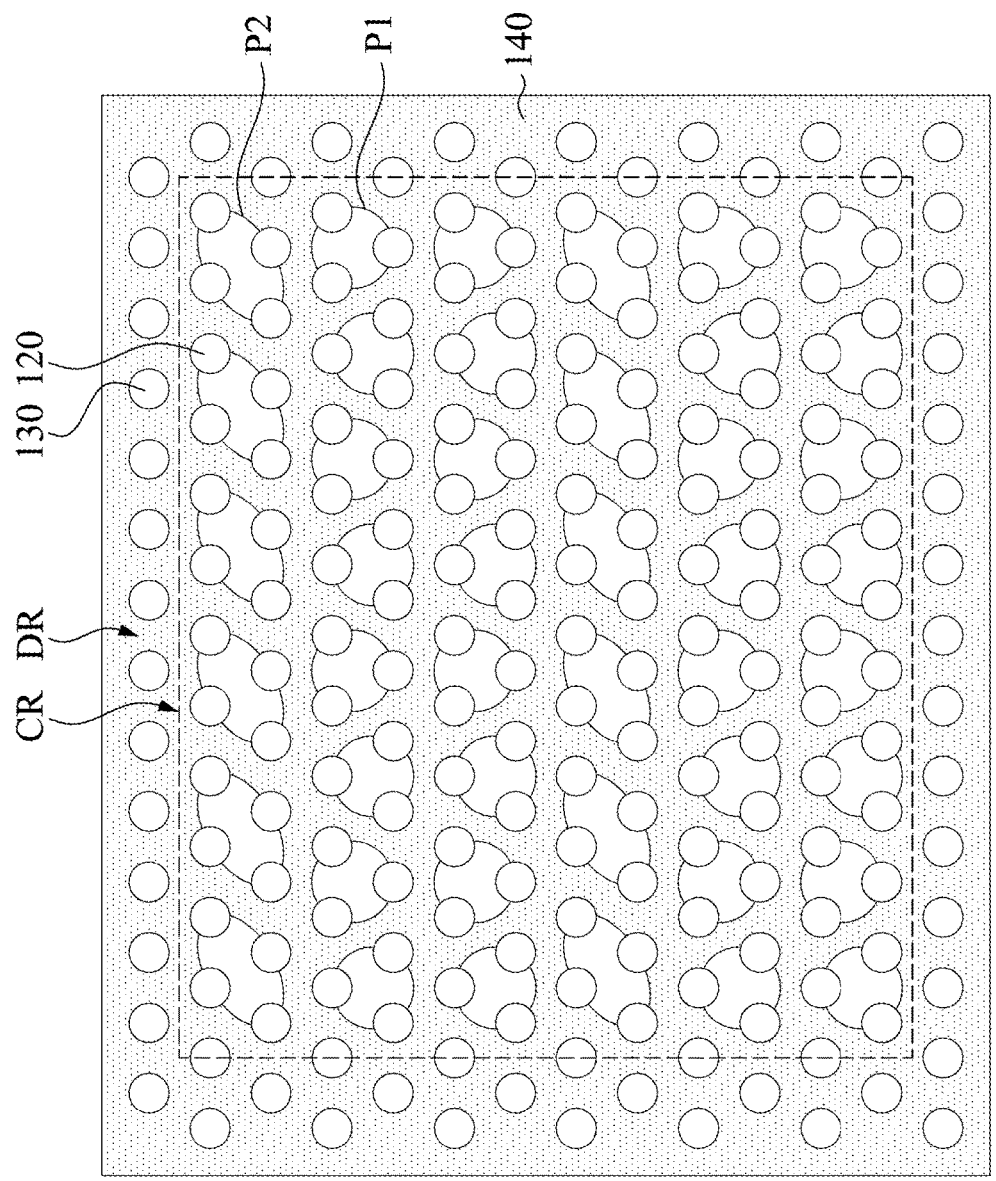
FIG. 3 is a top view illustrating a semiconductor device according to another embodiment of the present disclosure.

FIG. 3 is a top view illustrating a semiconductor device 100a according to another embodiment of the present disclosure. The difference between the semiconductor device 100a of FIG. 3 and the semiconductor device 100 of FIG. 2 lies on the arrangement of the first opening patterns P1 and the second opening patterns P2 in the first direction D1. Specifically, the second opening patterns P2 are repeatedly arranged in the first (topmost) row and the fourth row in the second direction D2, and the first opening patterns P1 are repeatedly arranged in the second row, the third row, the fifth row, and the sixth (bottommost) row in the second direction D2.

Figure 4:
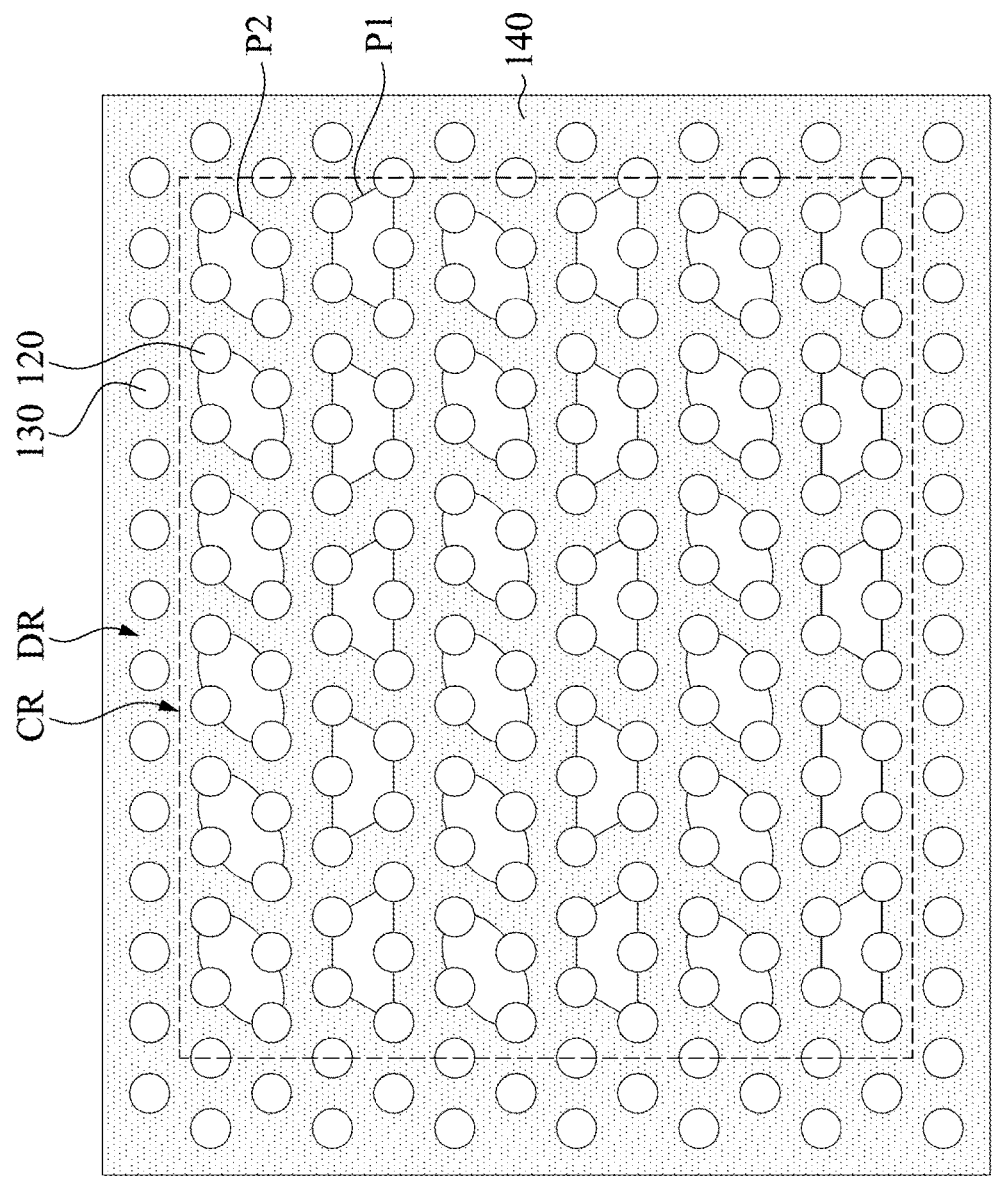
FIG. 4 is a top view illustrating a semiconductor device according to another embodiment of the present disclosure.

FIG. 4 is a top view illustrating a semiconductor device 100b according to another embodiment of the present disclosure. The difference between the semiconductor device 100b of FIG. 4 and the semiconductor device 100 of FIG. 2 lies on the first number of the memory pillar structures 120 surrounding each of the first patterns P1 and the second number of the memory pillar structures 120 surrounding each of the second patterns P2. Specifically, in the semiconductor device 100a, four memory pillar structures 120 surround each of the first patterns P1, and five memory pillar structures 120 surround each of the second patterns P2. In other words, the first number of the memory pillar structures 120 is four, and the second number of the memory pillar structures 120 is five. Furthermore, each of the first opening patterns P1 has a trapezoidal shape, and each of the second opening patterns P2 has an oval shape.

Figure 5:
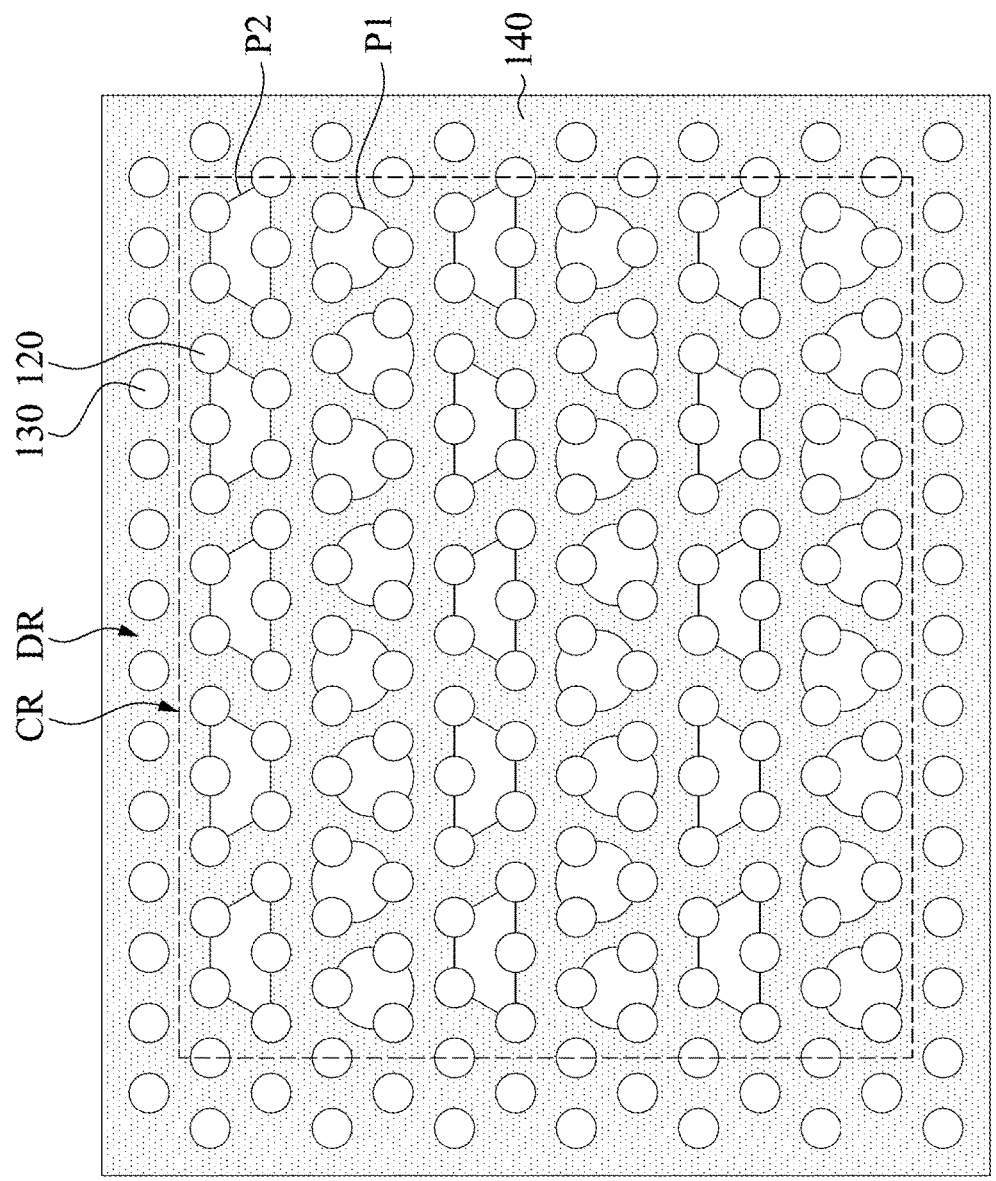
FIG. 5 is a top view illustrating a semiconductor device according to another embodiment of the present disclosure.

FIG. 5 is a top view illustrating a semiconductor device 100c according to another embodiment of the present disclosure. The difference between the semiconductor device 100c of FIG. 5 and the semiconductor device 100 of FIG. 2 lies on the second number of the memory pillar structures 120 surrounding each of the second patterns P2. Specifically, five memory pillar structures 120 surround each of the second patterns P2. In other words, the second number of the memory pillar structures 120 is five. Furthermore, each of the first opening patterns P1 has a circular shape, and each of the second opening patterns P2 has a trapezoidal shape.

FIGS. 6-13 are cross-sectional views of processes at various stages of a manufacturing method of the semiconductor device 100 according to an embodiment of the present disclosure. In the following description, the manufacturing method of the semiconductor device 100 will be described.

Figure 6:
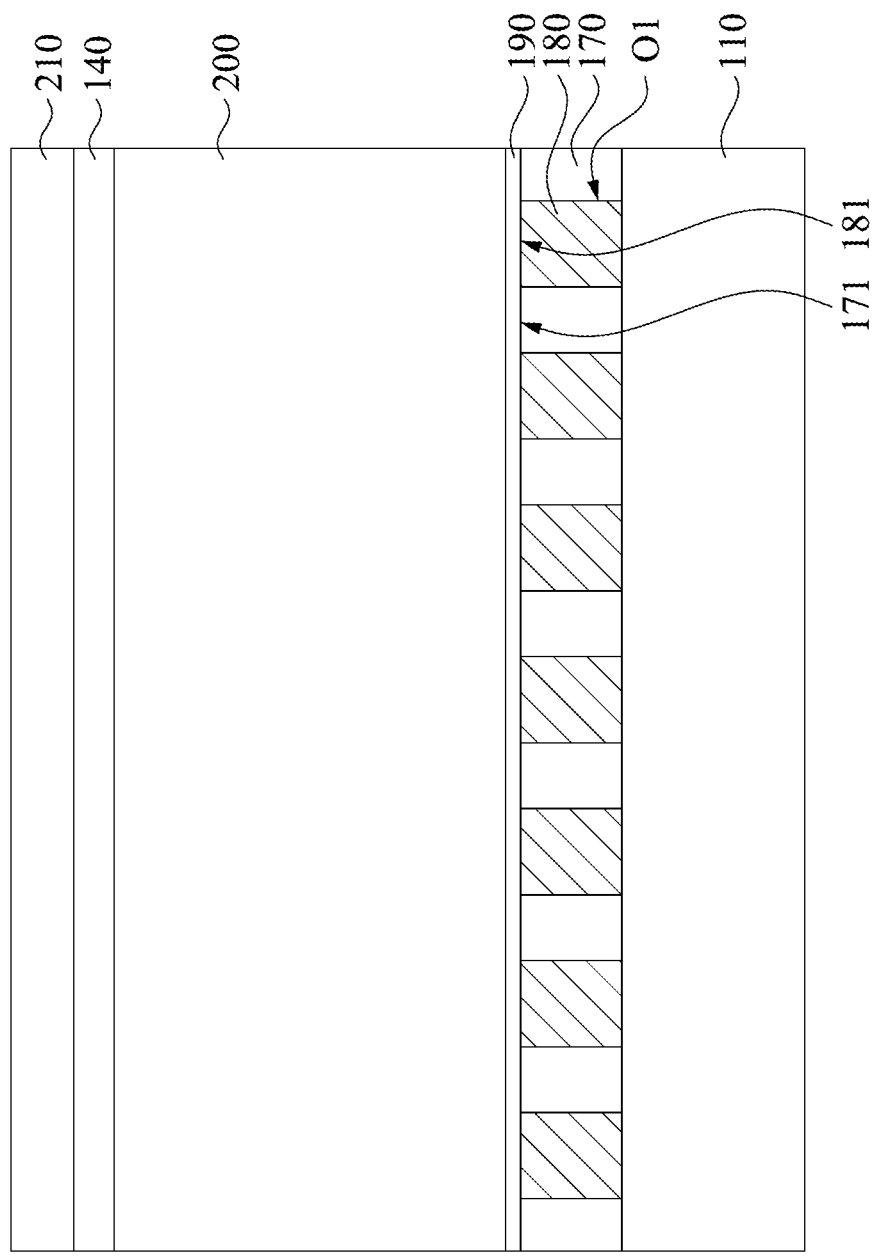
FIGS. 6-13 are cross-sectional views of processes at various stages of a manufacturing method of a semiconductor device according to an embodiment of the present disclosure.

Reference is made to FIG. 6. The semiconductor substrate 110 is provided, and the interlayer dielectric 170 is formed on the semiconductor substrate 110. The interlayer dielectric 170 is then etched to form holes O1 exposing portions of the semiconductor substrate 110, and the holes O1 may then be filled with a conductive material, followed by a planarization process of the conductive material to form the conductive structures 180, such that the top surface 171 of the interlayer dielectric 170 is coplanar with the top surfaces 181 of the conductive structures 180.

After that, the second dielectric layer 190 is formed on the interlayer dielectric 170 and the conductive structures 180. A first sacrificial layer 200, the supporting layer 140, and a second sacrificial layer 210 are then sequentially formed on the second dielectric layer 190. The second dielectric layer 190 may serve as an etch stop layer including a material having an etching selectivity with respect to a material of the first sacrificial layer 200. For example, the second dielectric layer 190 may be made of a material including silicon nitride, while the first sacrificial layer 200 may be made of a material including silicon oxide.

Figure 7:
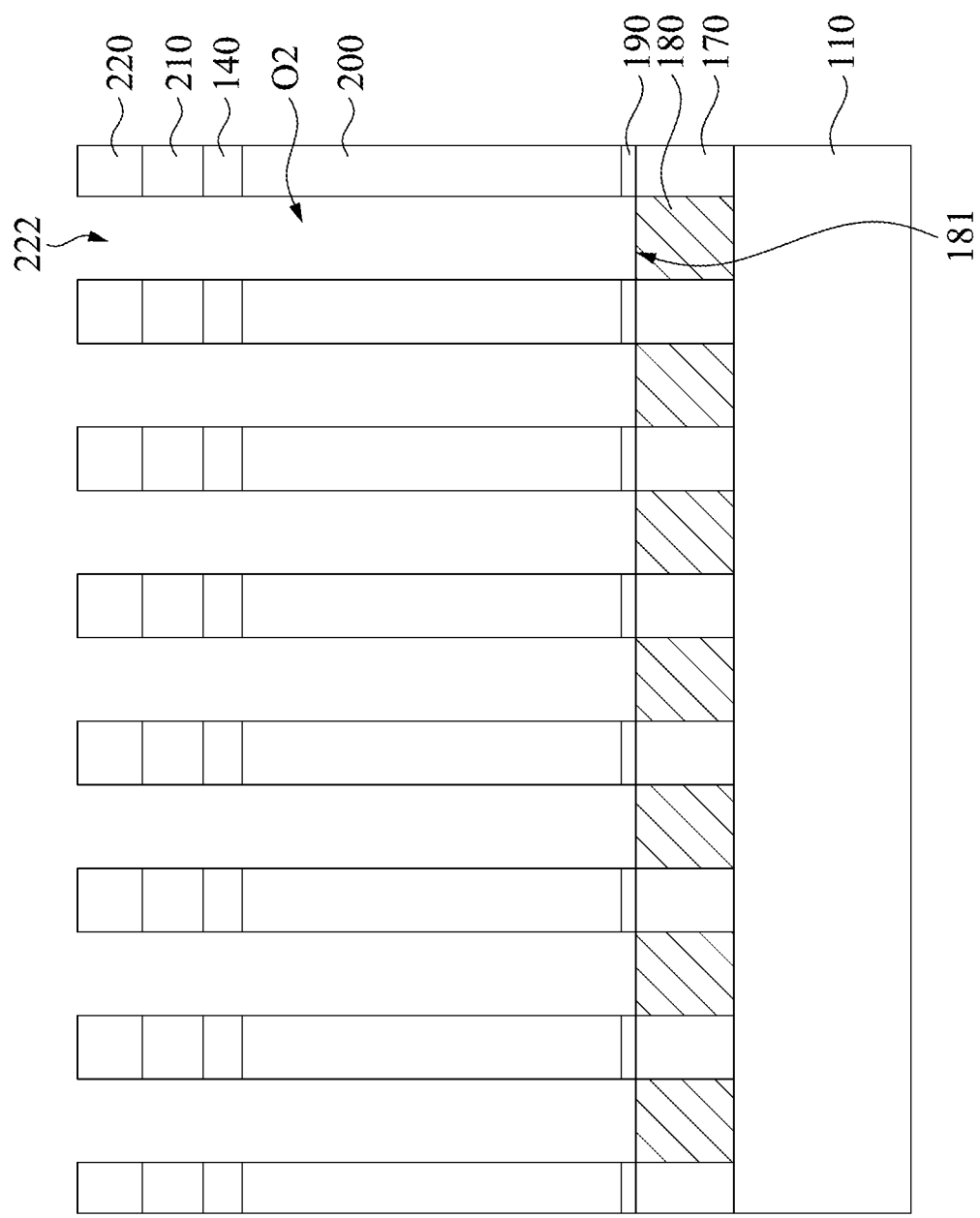

Reference is made to FIG. 7. A first mask pattern 220 may be formed on the second sacrificial layer 210 to define openings 222 for holes O2. The openings 222 of the first mask pattern 220 may be respectively above the conductive structures 180. The first mask pattern 220 may be used as an etching mask to sequentially pattern the second sacrificial layer 210, the supporting layer 140, and the first sacrificial layer 200, such that portions of the second dielectric layer 190 are exposed. After that, the exposed portions of the second dielectric layer 190 are further etched. As a result, the holes O2 are formed to respectively expose the top surfaces 181 of the conductive structures 180.

Figure 8:
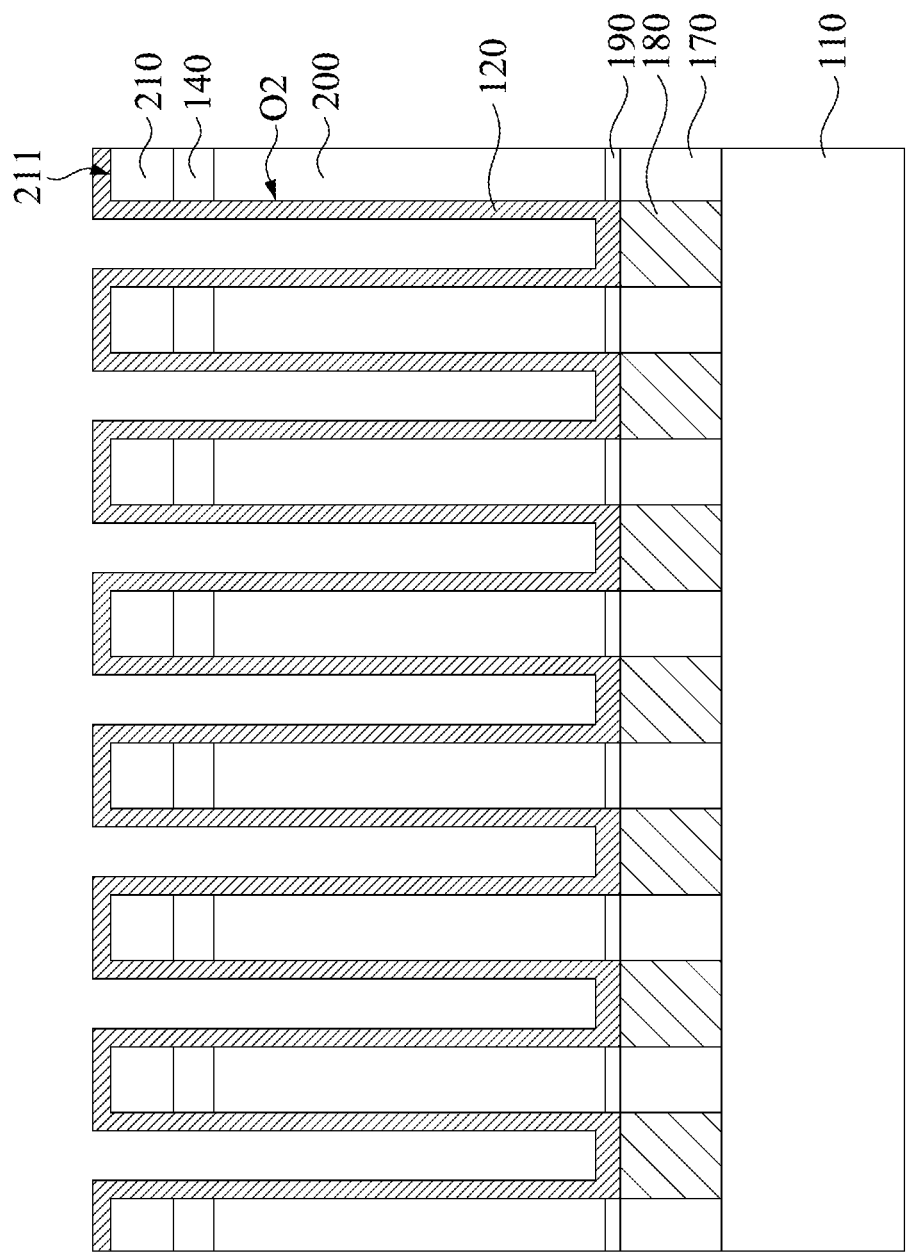

Reference is made to FIG. 8. The first mask pattern 220 is then removed. For example, when the first mask pattern 220 is formed of a photoresist pattern, an ashing process may be employed to remove the first mask pattern 220. A material of the memory pillar structures 120 is then conformally formed in the holes O2 and on the second sacrificial layer 210. As such, the conductive structures 180, the second dielectric layer 190, the first sacrificial layer 200, the supporting layer 140, and the second sacrificial layer 210 are covered by the material of the memory pillar structures 120. Although the dummy pillar structures 130 of FIG. 1 are not shown in FIG. 8, the formation of the dummy pillar structures 130 is similar to that of the memory pillar structures 120, and the dummy pillar structures 130 and the dummy pillar structures 130 can be formed simultaneously in the same step.

Figure 9:
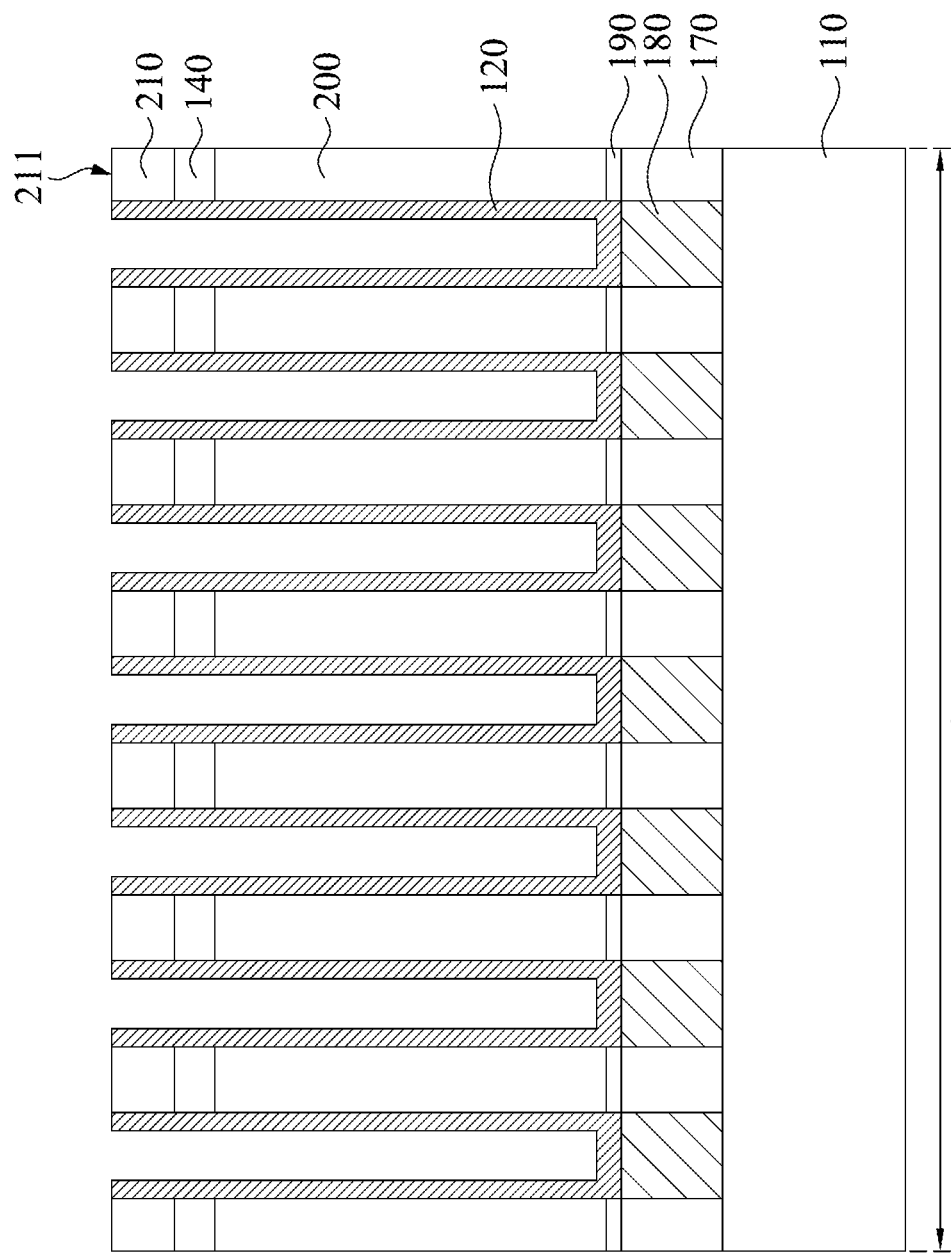

Reference is made to FIG. 9. A planarization process is then performed such that a top portion of the material of memory pillar structures 120 covering the second sacrificial layer 210 is removed, thereby exposing a top surface 211 of the second sacrificial layer 210. After this step, the memory pillar structure 120 (i.e., the bottom electrode layer) of each of the capacitor on the cell region CR are formed.

Figure 10:
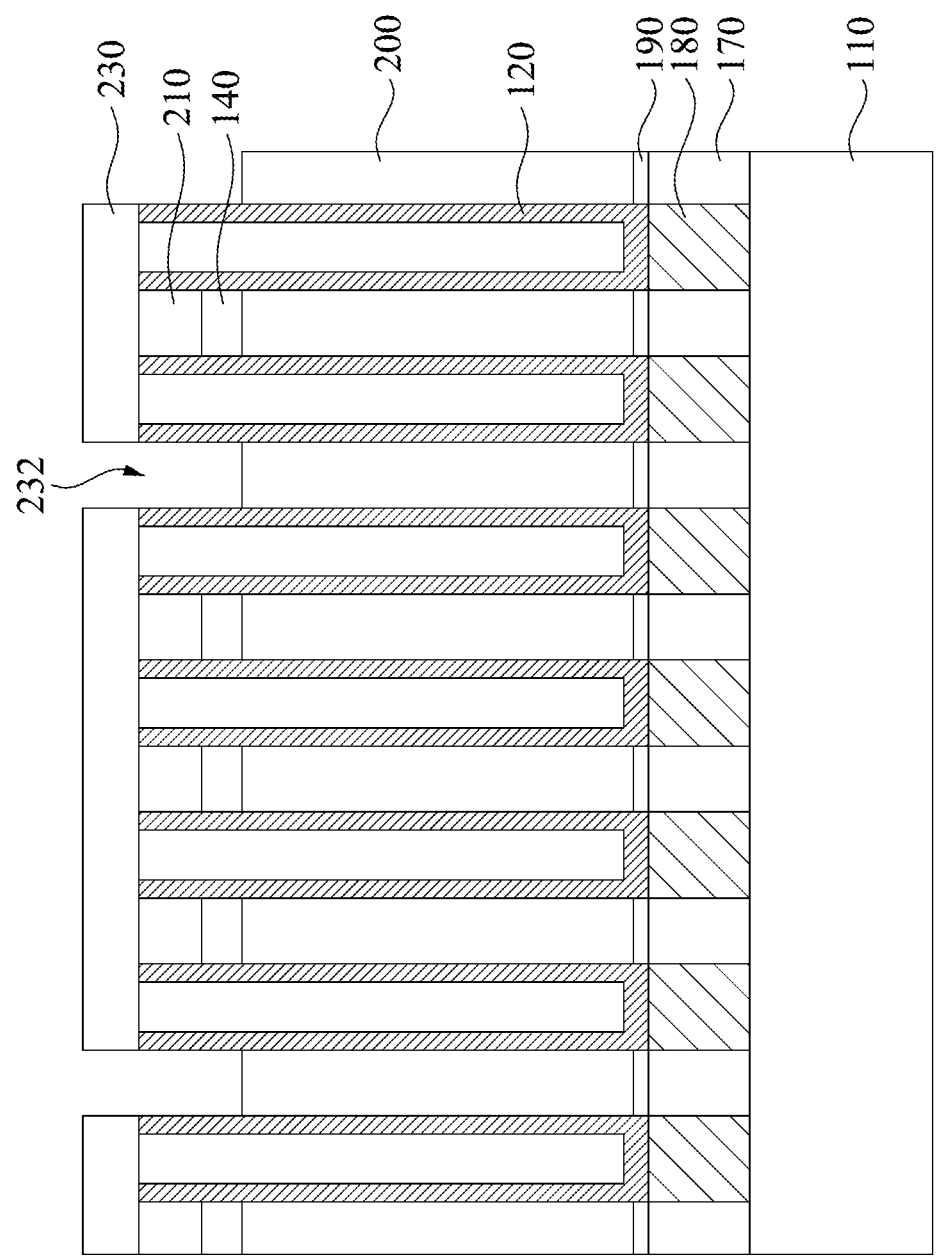

Reference is made to FIG. 10. A second mask pattern 230 may be formed on the memory pillar structures 120 and the second sacrificial layer 210. The second mask pattern 230 has openings 232 defining shapes of the first opening patterns P1 and the second opening patterns P2 shown in FIG. 1. For example, the second mask pattern 230 may include the openings 232 having shapes and positions corresponding to those of the first opening patterns P1 and the second opening patterns P2. An etching process is then performed to remove portions of the second sacrificial layer 210 that are exposed through the openings 232 of the second mask pattern 230. The etching process further removes portions of the supporting layer 140 below the removed second sacrificial layer 210. As a result, portions of the first sacrificial layer 200 below the removed supporting layer 140 are exposed through the openings 232 of the second mask pattern 230.

Figure 11:
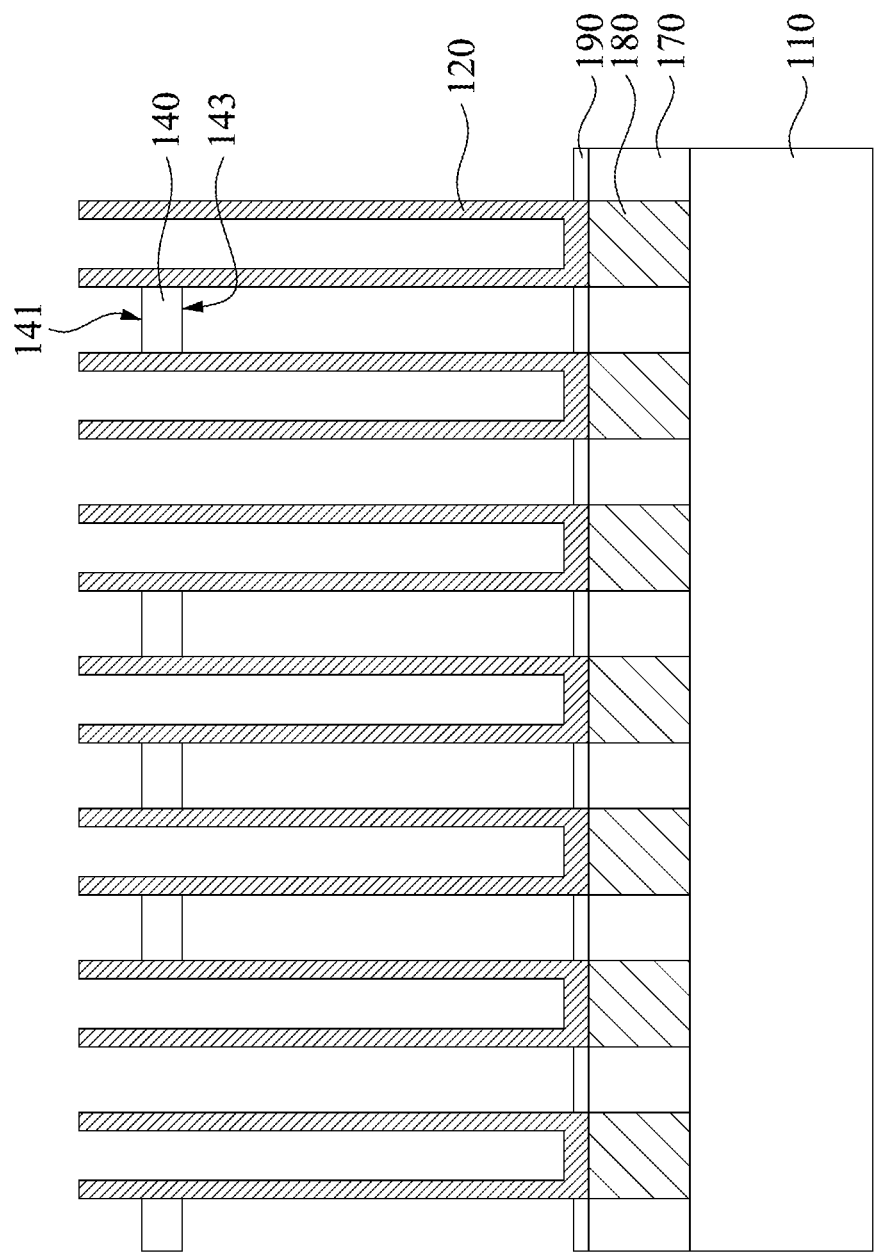

Reference is made to FIG. 11. The second mask pattern 230 may then be removed to expose the memory pillar structures 120 and the remaining portions of the second sacrificial layer 210. An isotropic etching process may be performed to completely remove the first sacrificial layer 200 and the second sacrificial layer 210 to expose sidewalls of the memory pillar structures 120, a top surface 191 of the second dielectric layer 190, and a top surface 141 and a bottom surface 143 of the supporting layer 140. In this step, the supporting layer 140 connects the sidewalls of the memory pillar structures 120 to prevent the memory pillar structures 120 from collapsing.

Because the semiconductor device 100 has the dummy region DR (shown in FIG. 1) surrounding the cell region CR, the edge portion of the cell region CR is no longer an external edge of the semiconductor substrate 110. As a result, the dummy region DR enables the edge portion of the cell region CR to have the same etching condition as the central portion of the cell region CR. In other words, the dummy region DR facilitates a same etching condition through the entire cell region CR.

Figure 12:
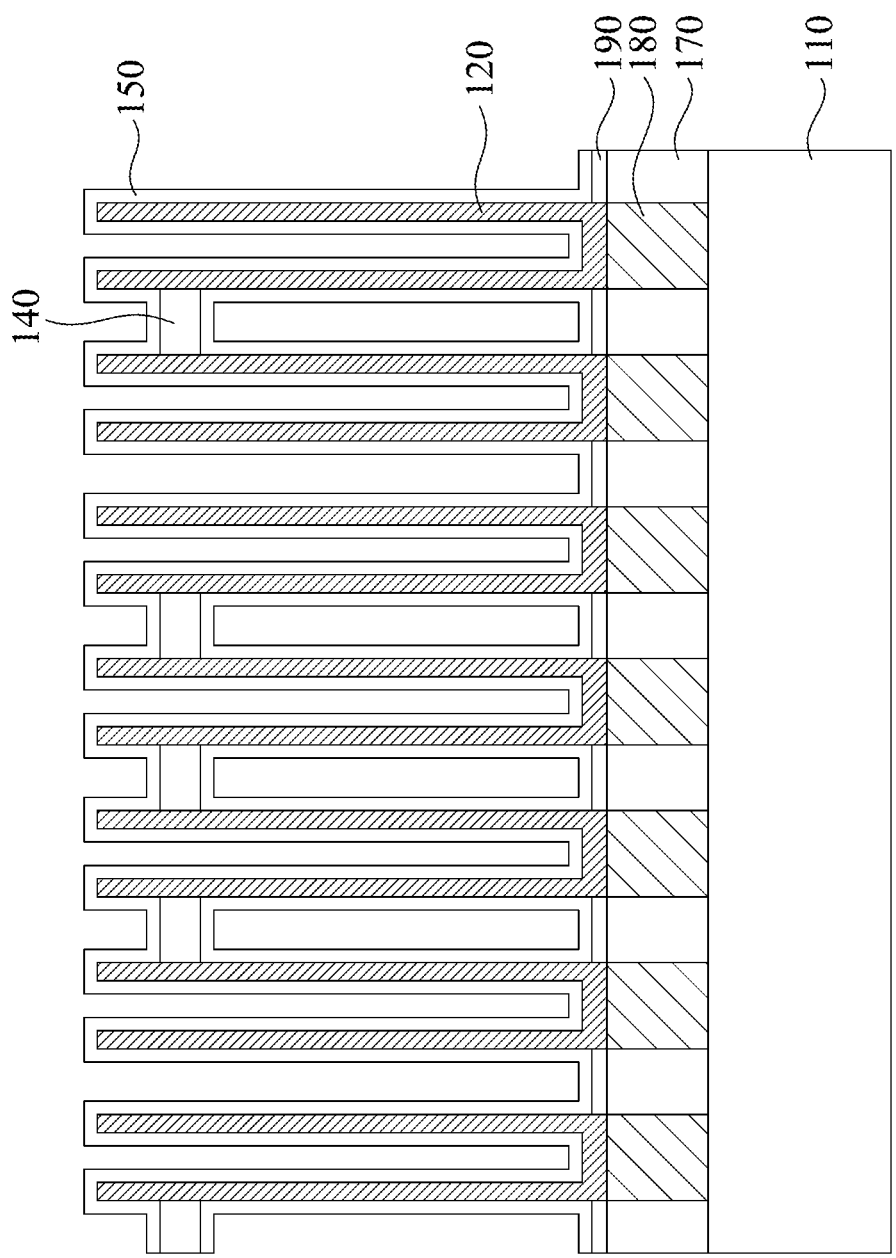
Figure 13:
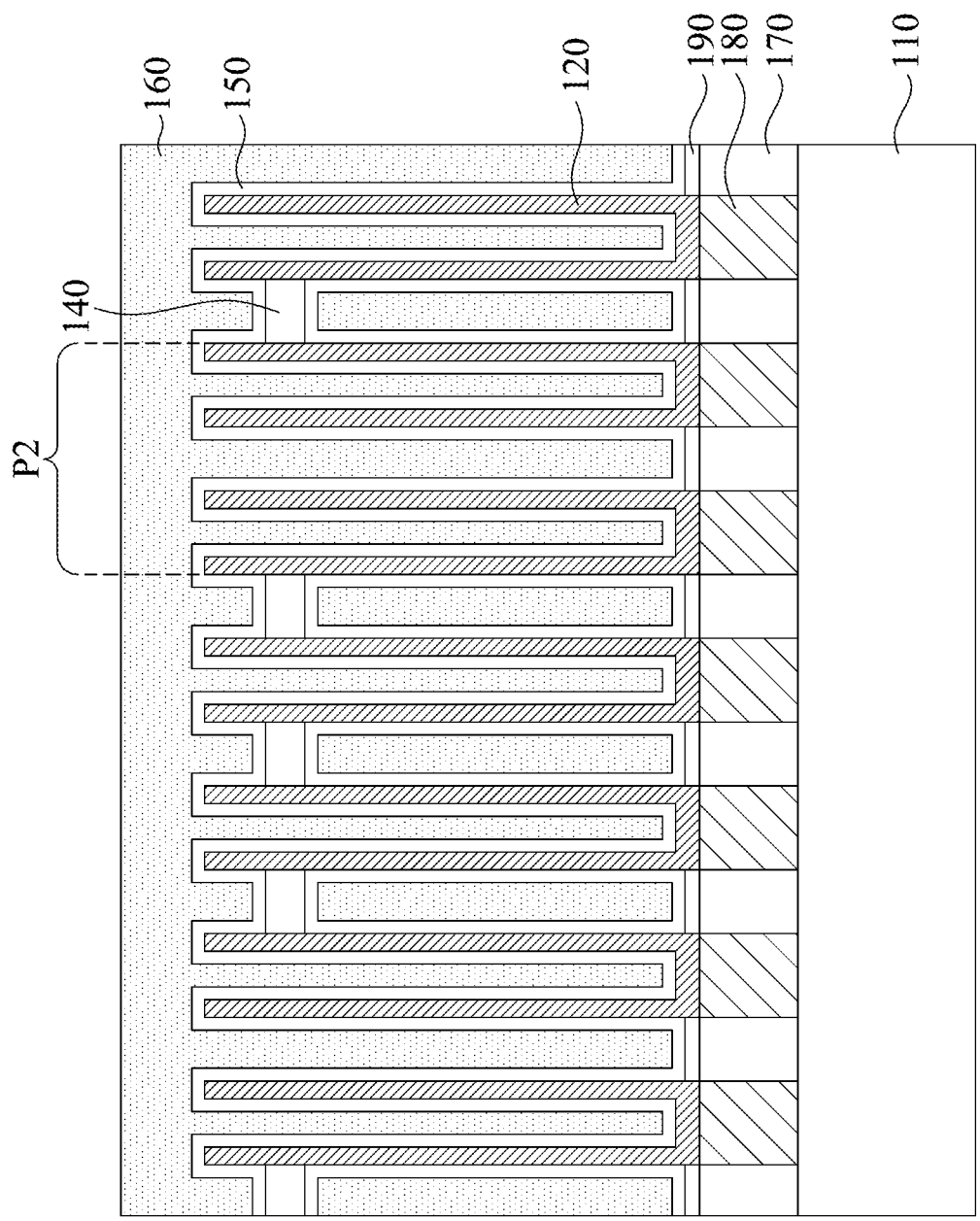

Reference is made to FIG. 12 and FIG. 13. The first dielectric layer 150 is then conformally formed to cover the exposed surfaces of the supporting layer 140 and the exposed surfaces of the memory pillar structures 120. After that, the top electrode layer 160 is then formed on the first dielectric layer 150, such that the semiconductor device 100 having the first opening patterns P1, the second opening patterns P2, and the capacitors with a high aspect ratio shown in FIG. 1 are formed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:
1. A semiconductor device, comprising:
a semiconductor substrate having a cell region and a dummy region surrounding the cell region;
a plurality of memory pillar structures on the cell region of the semiconductor substrate; and
a supporting layer over the semiconductor substrate, interconnecting the memory pillar structures; and
a plurality of first opening patterns and second opening patterns on the cell region, wherein the supporting layer and a first number of the memory pillar structures surround each of the first opening patterns and form a boundary of the each of the first opening patterns without extending into each of the first opening patterns, the supporting layer and a second number of the memory pillar structures surround each of the second opening patterns and form a boundary of the each of the second opening patterns without extending into each of the second opening patterns, the first opening patterns are different from the second opening patterns, the first number of the memory pillar structures is different from the second number of the memory pillar structures, some of the first opening patterns and some of the second opening patterns are on a central portion of the cell region, and a remaining of the first opening patterns and a remaining of the second opening patterns are on an edge portion of the cell region, wherein the edge portion surrounds the central region, the dummy region surrounds the edge portion, and the edge portion is between the dummy region and the central region.

2. The semiconductor device of claim 1, further comprising a plurality of dummy pillar structures on the dummy region of the semiconductor substrate.

3. The semiconductor device of claim 1, wherein shapes of the first opening patterns are the same, and shapes of the second opening patterns are the same.

4. The semiconductor device of claim 1, wherein the first opening patterns and the second opening patterns are staggered in a first direction.

5. The semiconductor device of claim 1, wherein the first opening patterns or the second opening patterns are repeatedly arranged in a second direction.

6. The semiconductor device of claim 1, wherein the first number of the memory pillar structures is less than the second number of the memory pillar structures.

7. The semiconductor device of claim 6, wherein the first number of the memory pillar structures is three, and the second number of the memory pillar structures is four.

8. The semiconductor device of claim 6, wherein the first number of the memory pillar structures is three, and the second number of the memory pillar structures is five.

9. The semiconductor device of claim 6, wherein the first number of the memory pillar structures is four and the second number of the memory pillar structures is five.

10. The semiconductor device of claim 1, further comprising:
    an interlayer dielectric on the semiconductor substrate; and
    a plurality of conductive structures in the interlayer dielectric, wherein the memory pillar structures are respectively on the conductive structures.

11. The semiconductor device of claim 10, wherein the memory pillar structures are respectively aligned with the conductive structures.

12. The semiconductor device of claim 10, wherein the memory pillar structures are respectively in contact with top surfaces of the conductive structures.

13. The semiconductor device of claim 1, wherein each of the memory pillar structures comprises a horizontal portion and a vertical portion surrounding the horizontal portion.

14. The semiconductor device of claim 13, further comprising:
    a top electrode layer over the memory pillar structures and the supporting layer, wherein the top electrode layer has portions surrounded by the vertical portions of the memory pillar structures.

15. The semiconductor device of claim 1, wherein each of the memory pillar structures is a bottom electrode layer with a U cross-sectional shape.

16. The semiconductor device of claim 15, further comprising:
    a first dielectric layer disposed along the supporting layer and the memory pillar structures; and
    a top electrode layer over the first dielectric layer.

17. The semiconductor device of claim 16, further comprising a second dielectric layer between the first dielectric layer and the interlayer dielectric.

* * * * *